(12) United States Patent
Then et al.

(10) Patent No.: US 10,777,672 B2
(45) Date of Patent: Sep. 15, 2020

(54) GALLIUM NITRIDE TRANSISTORS FOR HIGH-VOLTAGE RADIO FREQUENCY SWITCHES

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/084,203

(22) PCT Filed: Mar. 28, 2016

(86) PCT No.: PCT/US2016/024399
§ 371 (c)(1),
(2) Date: Sep. 11, 2018

(87) PCT Pub. No.: WO2017/171695
PCT Pub. Date: Oct. 5, 2017

(65) Prior Publication Data
US 2019/0074368 A1    Mar. 7, 2019

(51) Int. Cl.
| H01L 29/778 | (2006.01) |
| H01L 29/66 | (2006.01) |
| H01L 29/20 | (2006.01) |
| H01L 23/66 | (2006.01) |
| H01L 29/205 | (2006.01) |
| H01L 29/78 | (2006.01) |
| H01L 29/423 | (2006.01) |
| H01L 29/08 | (2006.01) |

(52) U.S. Cl.
CPC .......... *H01L 29/7787* (2013.01); *H01L 23/66* (2013.01); *H01L 29/2003* (2013.01); *H01L 29/205* (2013.01); *H01L 29/66462* (2013.01); *H01L 29/7786* (2013.01); *H01L 29/0847* (2013.01); *H01L 29/4236* (2013.01); *H01L 29/7831* (2013.01)

(58) Field of Classification Search
None
See application file for complete search history.

(56) References Cited

U.S. PATENT DOCUMENTS

| 2010/0052014 A1 | 3/2010 | Matsushita |
| 2014/0084331 A1 | 3/2014 | Parthasarathy et al. |

(Continued)

OTHER PUBLICATIONS

PCT Dec. 20, 2016 International Search Report and Written Opinion issued in PCT Application No. PCT/US2016/024399 dated Dec. 20, 2016; 12 pages.

*Primary Examiner* — David E Graybill
(74) *Attorney, Agent, or Firm* — Patent Capital Group

(57) ABSTRACT

Embodiments of this disclosure are directed to a multi-gate gallium nitride (GaN) transistor and methods of making the same. The multi-gate GaN transistor includes a gallium nitride layer. The GaN transistor includes two or more gate electrodes between a drain electrode and a source electrode. A polarization layer is located between the first gate electrode and the second gate electrode, the polarization layer forming a two dimensional electron gas (2DEG) within the GaN layer, the 2DEG electrically coupling the first gate electrode and the second gate electrode.

25 Claims, 12 Drawing Sheets

(56) References Cited

U.S. PATENT DOCUMENTS

2014/0151747 A1 6/2014 Jeon et al.
2014/0361343 A1 12/2014 Sriram
2015/0187924 A1 7/2015 Dasgupta et al.

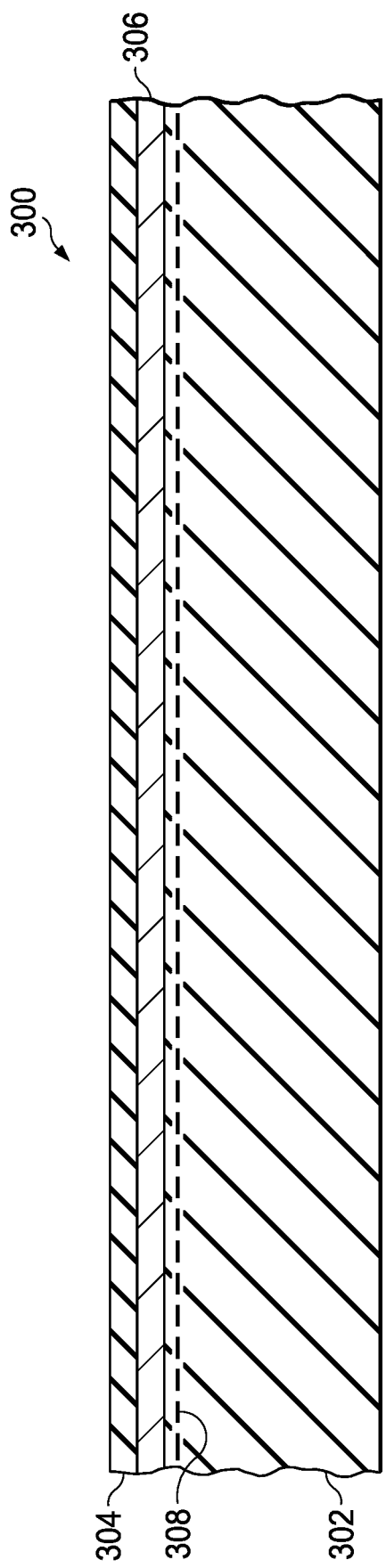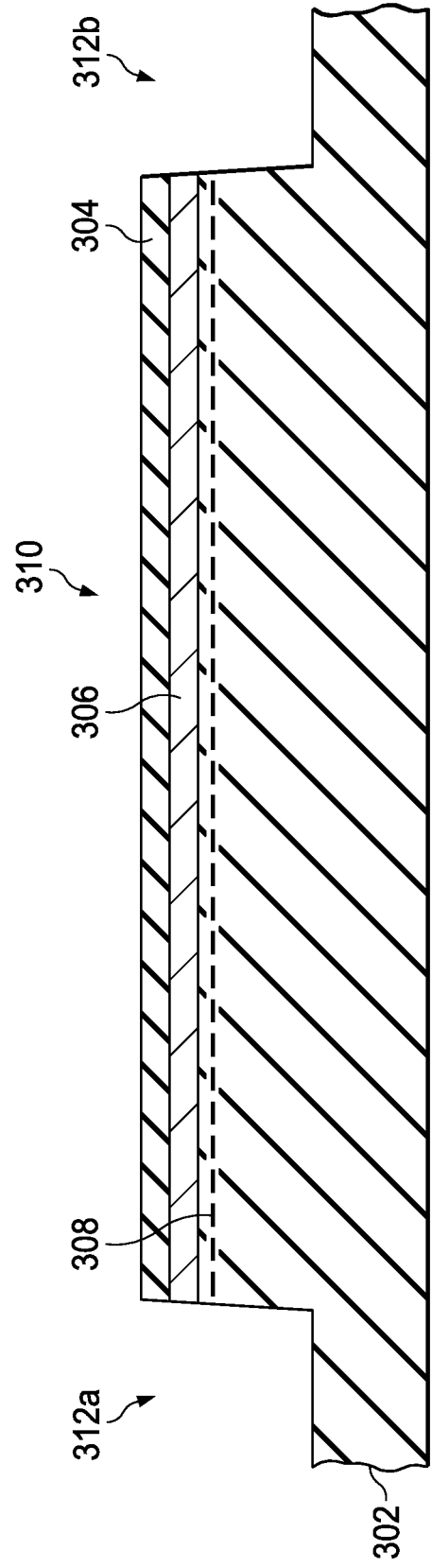
FIG. 3A
FIG. 3B

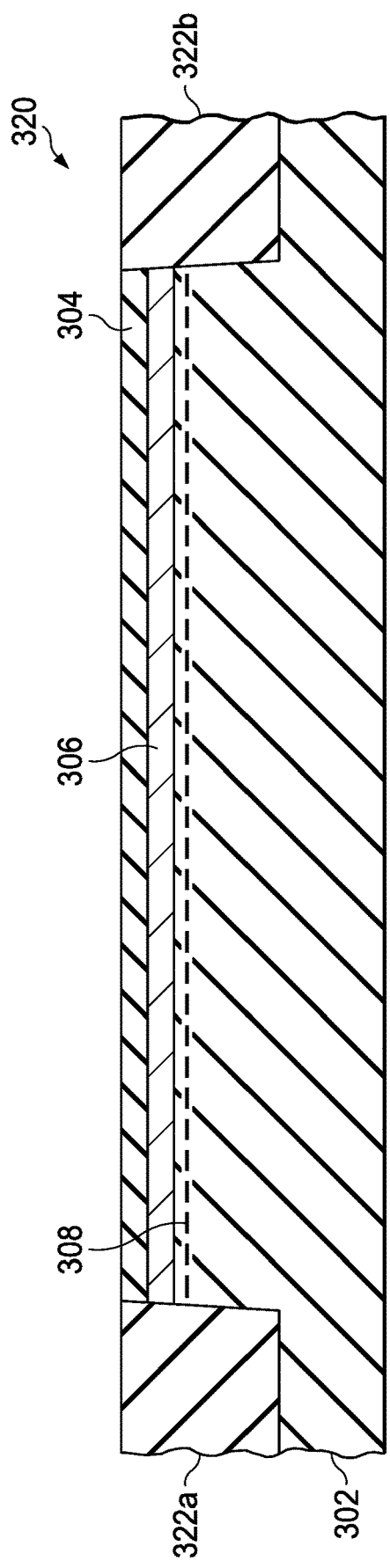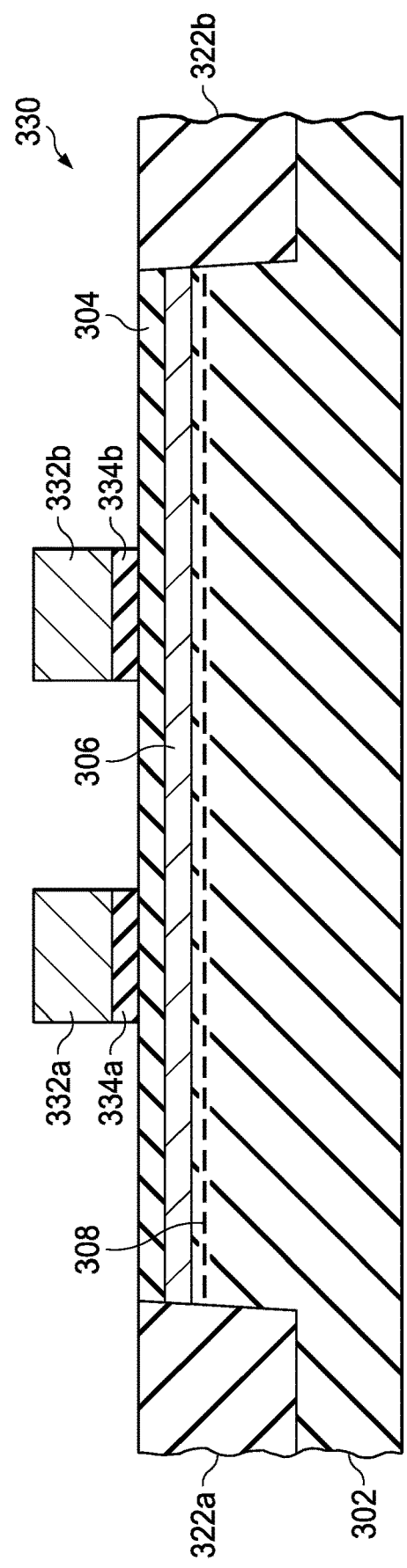

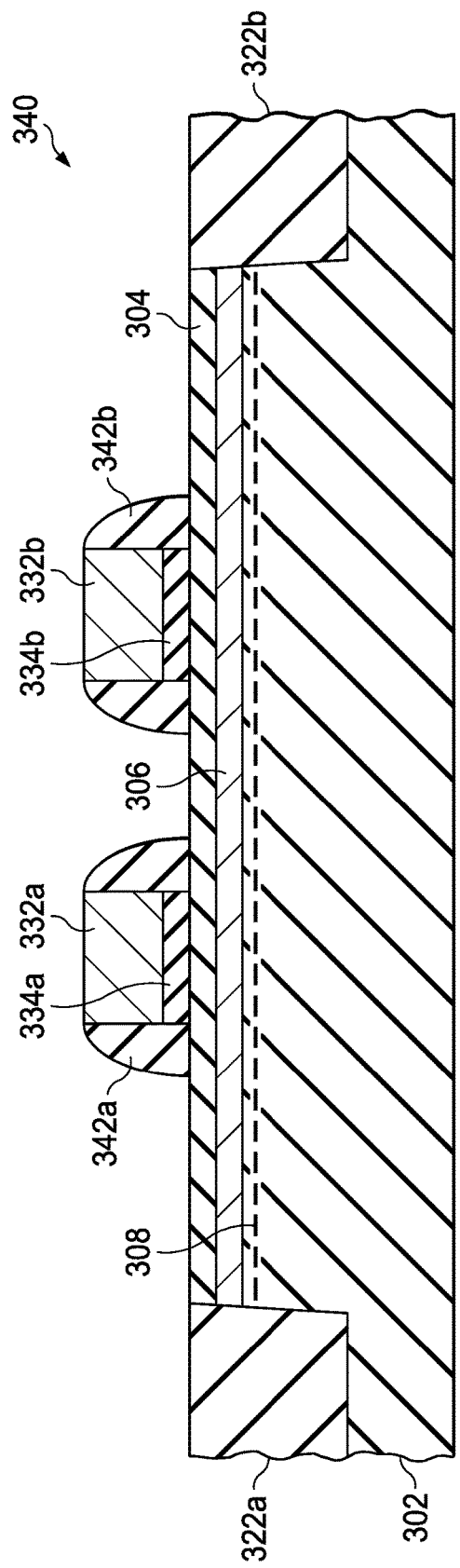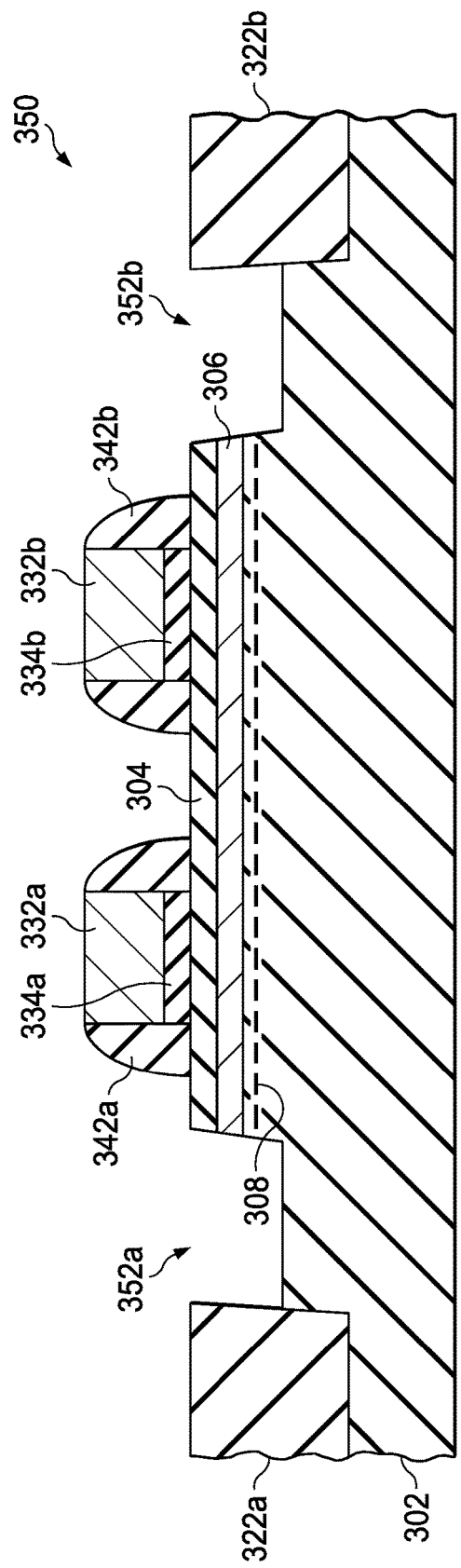

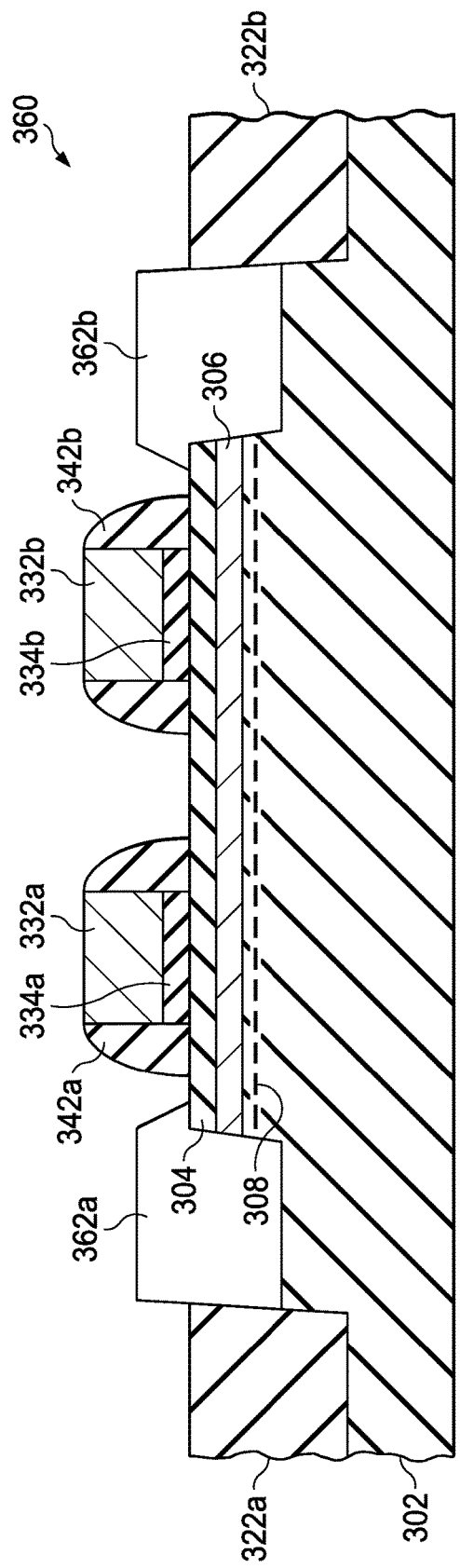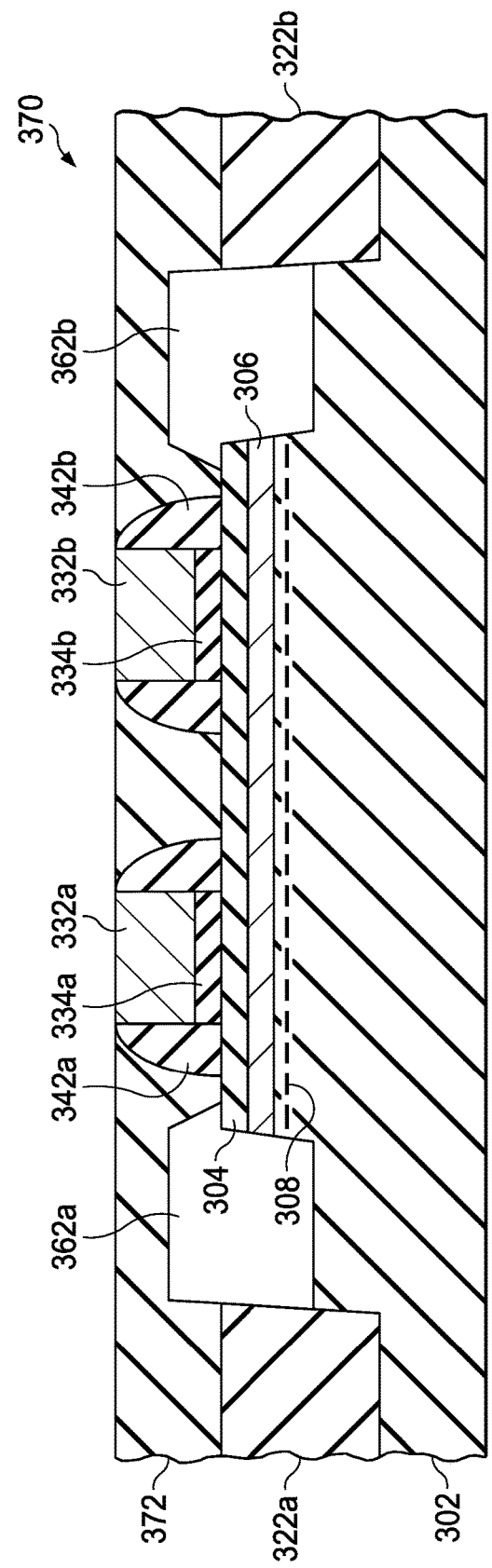

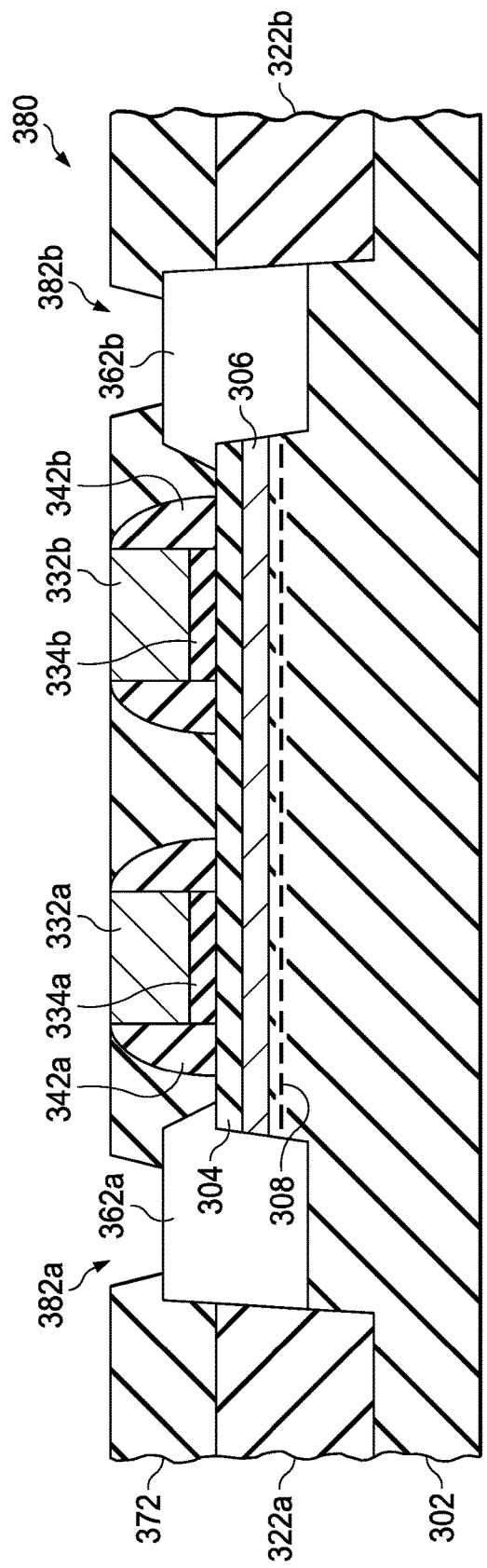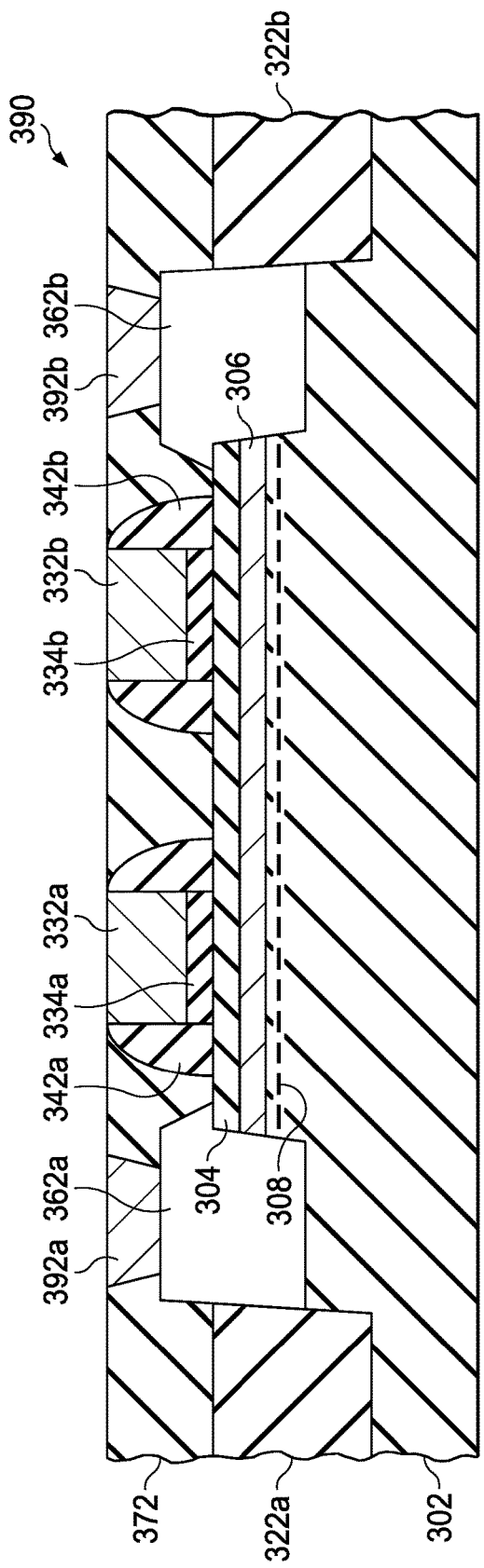
FIG. 3I
FIG. 3J

GALLIUM NITRIDE TRANSISTORS FOR HIGH-VOLTAGE RADIO FREQUENCY SWITCHES

CROSS-REFERENCE TO RELATED APPLICATIONS

This Application is a national stage application under 35 U.S.C. § 371 of PCT Application PCT/US2016/024399, filed Mar. 28, 2016, and entitled "GALLIUM NITRIDE TRANSISTORS FOR HIGH-VOLTAGE RADIO FREQUENCY SWITCHES," which is hereby incorporated by reference in its entirety.

TECHNICAL FIELD

This disclosure pertains to gallium nitride transistors for high voltage radio frequency switches, and more particularly, to multiple gate enhancement mode gallium nitride transistors with a single source and drain for high-voltage radio frequency switches.

BACKGROUND

Radio Frequency (RF) switches can be used for switching and routing of high frequency signals. Various materials have been used to form transistors for RF switches. For example, silicon on insulator (SOI) transistors and gallium arsenide (GaAs) pseudomorphic High Electron Mobility Transistors (pHEMT) have been used. Si RF SOI transistors can have high on resistance due to multiple stacking (as many as 14 transistors in series) in order to handle high breakdown voltage. GaAs pHEMT is a depletion mode transistor technology and can use separate supply voltage to the gate to turn the transistor off. The supply voltage in a mobile system is typically limited to either 3.7V (1S battery) or 7.4V (2S battery).

BRIEF DESCRIPTION OF THE DRAWINGS

FIG. 3A-3L are schematic diagrams illustrating a process flow for fabricating a multi-gate gallium nitride transistor.

DETAILED DESCRIPTION

Due to its wide bandgap and high critical breakdown electric field, gallium nitride (GaN) transistors can be used to replace Si RF SOI and GaAs for RF switches. Today's state-of-the-art Si RFSOI and GaAs pHEMT have limitations that can be solved with GaN technology.

For example, Si RF SOI transistors can have high on-resistances. For example, the on-resistance for an Si RF SOI transistor can be expressed as R(on)=n*R(on_single gate)= n*2Rcc+n*Rch+n*Rac. Rcc is the contact resistance from N+ Source/Drain to the access region, and Rac is the lateral resistance of the access region from Source/Drain to Channel. The on-resistance for the GaAs transistor can be expressed as R(on)=2RCC+n*Rch+n*2Rac.

Both Si and GaAs transistors have high on resistance, and as a result, very large transistor widths are used to achieve low insertion loss for RF switch application. Moreover, large transistor widths are typically accompanied by large parasitics (capacitance and leakage) which are detrimental to performance and power efficiency.

This disclosure describes using a multi-gate GaN transistor architecture that uses the low resistance of the 2D electron gas in GaN channel to achieve ON resistance (Ron) that is significantly better than the on-resistances of the Si RF SOI and the GaAs transistors.

The multiple gates are used to distribute the high gate voltage needed to keep the channel in the off-state under a large RF input voltage swing from Drain to Source. By distributing the gate voltage, the multi-gate GaN RF switch transistor can be used in mobile systems where the supply voltage is typically limited to either 3.7V (1S battery) or 7.4V (2S battery).

The Rcc components for Si, GaAs and GaN transistors are comparable. The largest resistive contribution to RON in a Si RF SOI MOSFET is Rac due to the lightly-doped Si access region. GaAs pHEMT uses delta-doped quantum-wells and its high electron mobility to achieve a significantly lower Rac than Si, but the charge density is limited to a range from $1*10^{12}/cm^2$ to $5*10^{12}/cm^2$. GaN offers very high 2DEG charge density in the range from $1*10^{13}/cm^2$ to $2*10^{13}/cm^2$ and moderately high mobility to enable low sheet resistance for significantly lower Rac than GaAs and Si.

Figure 1:
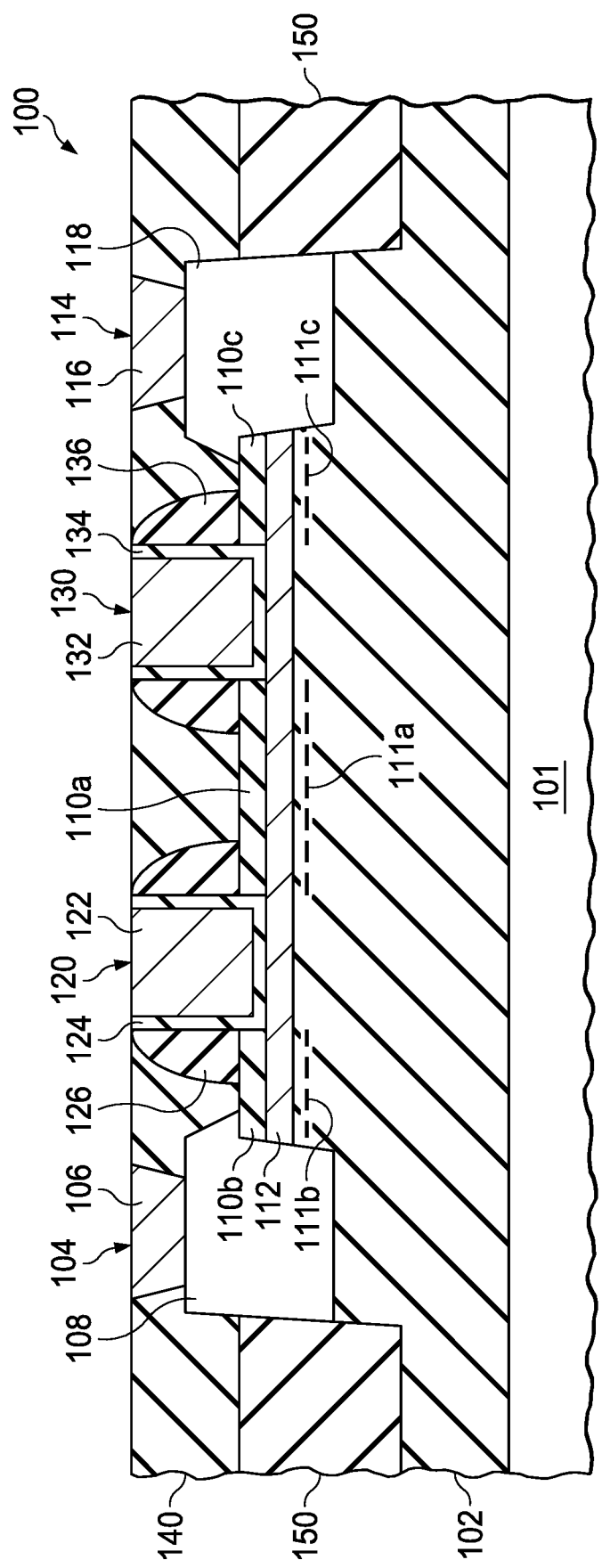
FIG. 1 is a schematic diagram of a gallium nitride transistor in accordance with embodiments of the present disclosure.

FIG. 1 is a schematic diagram of a gallium nitride transistor 100 in accordance with embodiments of the present disclosure. The gallium nitride (GaN) transistor 100 includes a GaN layer 102. The GaN layer 102 can reside on a silicon substrate 101 or can be an independent structure. The GaN transistor 100 also includes a drain electrode 104. The drain electrode 104 includes a drain metal 106, which can include for example titanium or tungsten. The drain electrode can also include a doped semiconductor portion 108 between the GaN layer 102 and the drain metal 106. The doped semiconductor portion 108 can include a doped nitride, such as indium gallium nitride ($In_xGa_{1-x}N$, where 5%<x<15%).

The GaN transistor 100 also includes a source electrode 114. The drain electrode 114 includes a source metal 116, which can include for example titanium or tungsten. The source electrode can also include a doped semiconductor portion 118 between the GaN layer 102 and the source metal 116. The doped semiconductor portion 118 can include a doped nitride, such as indium gallium nitride ($In_xGa_{1-x}N$, where 5%<x<15%).

The GaN transistor 100 also includes a first gate electrode 120. The first gate electrode 120 is located proximate the drain electrode 104. The first gate electrode 120 includes a gate metal 122, which can be titanium nitride for example. The first gate electrode 120 also includes a gate dielectric 124 that is located on the gate metal 122 sidewalls and between the gate metal 122 and the GaN layer 102. A spacer 126 can reside adjacent to the first gate electrode 120 (e.g., contacting the gate dielectride 124). The spacer 126 can be a dielectric material, such as silicon nitride.

A second gate electrode 130 is located proximate the first gate electrode 120 and proximate the source electrode 114. The second gate electrode 130 includes a gate metal 122, which can be titanium nitride for example. The second gate electrode 130 also includes a gate dielectric 134 that is located on the gate metal 132 sidewalls and between the gate metal 132 and the GaN layer 102. A spacer 136 can reside adjacent to the second gate electrode 130 (e.g., contacting the gate dielectride 134). The spacer 136 can be a dielectric material, such as silicon nitride.

The GaN transistor 100 also includes a polarization layer 110a located between the first gate electrode 120 and the second gate electrode 130. The polarization layer 110a can form a two dimensional electron gas (2DEG) 111a at an interface between the GaN layer 102 and the polarization layer 110a. In general, a 2DEG can be formed at the heterojunction of two Group III-nitride layers due to the difference in polarization between the two Group III nitride layer. For example, polarizations are inherent in Wurtzite Group III-Nitride crystals. One advantage of GaN transistors over others is that for GaN transistors, no impurity dopant is needed to form the conductive channel between the source, drain, and gate.

The presence of the 2DEG is illustrated in FIG. 1 as the dotted lines at the top of the GaN layer 102 and beneath each polarization layer 110a, 110b, and 110c. The 2DEG present at an interface between each polarization layer 110a, 110b, and 110c and the underlying GaN layer. The polarization layer 110a can be referred to as a first polarization layer or an inter-gate polarization layer. The polarization layer 110b that resides between the drain electrode 104 and the first gate electrode 120 can be referred to as a second polarization layer or a drain-side polarization layer. The polarization layer 110c that resides between the source electrode 114 and the second gate electrode 130 can be referred to as a third polarization layer or a source-side polarization layer.

The 2DEG 111b forms a conductive channel between the drain electrode 104 and the first gate electrode 120. Similarly, the 2DEG 111a forms a conductive channel between the first gate electrode 120 and the second gate electrode 130. The 2DEG 111c forms a conductive channel between the second gate electrode 130 and the source electrode 114.

The polarization layers 110a, 110b, and 110c, can be formed epitaxially on an aluminum nitride (AlN) interlayer 112. AlN layer 112 can help facilitate growth of the polarization layer 110a, 110b, and 110c. Growth of the polarization layers are discussed further in FIG. 3. Additionally, the AlN layer 112 can act as part of the gate electrode and can enhance the electron mobility in the GaN channel.

Also shown in FIG. 1 is the interlayer dielectric 140 that isolates the drain electrode from the gate electrodes and the isolates the gate electrodes from the source electrodes and isolates the gate electrodes from themselves.

Also shown in FIG. 1 is the isolation oxide (such as silicon dioxide) 150 that isolates the entire transistor from other transistors or structures on the substrate/wafer.

FIG. 1 shows a two-gated, planar GaN transistor but this disclosure contemplates the use of more than two gates. For example, stacking of a large number of gates (N>2) is also contemplated by this disclosure possible. Different transistor architectures, namely, narrow-width or finfet or nanowire/ gate-all-around architecture are also possible. Each of these gates can also be of different architecture, with one or more being planar in combination with one or multiple gates being finfets. Finfet and nanowire GaN could be advantageous in controlling DIBL, short-channel effects and sub-channel punch-through. The advantage of this multi-gate GaN transistor design is that the entire stack incurs the contact resistance of one N+ Source and one N+ Drain (2Rcc). The R(on) for the multi-gate GaN transistor can be expressed as R(on)=2Rcc+n*Rch+n*2Rac, where n is the number of gate electrodes.

Figure 2:
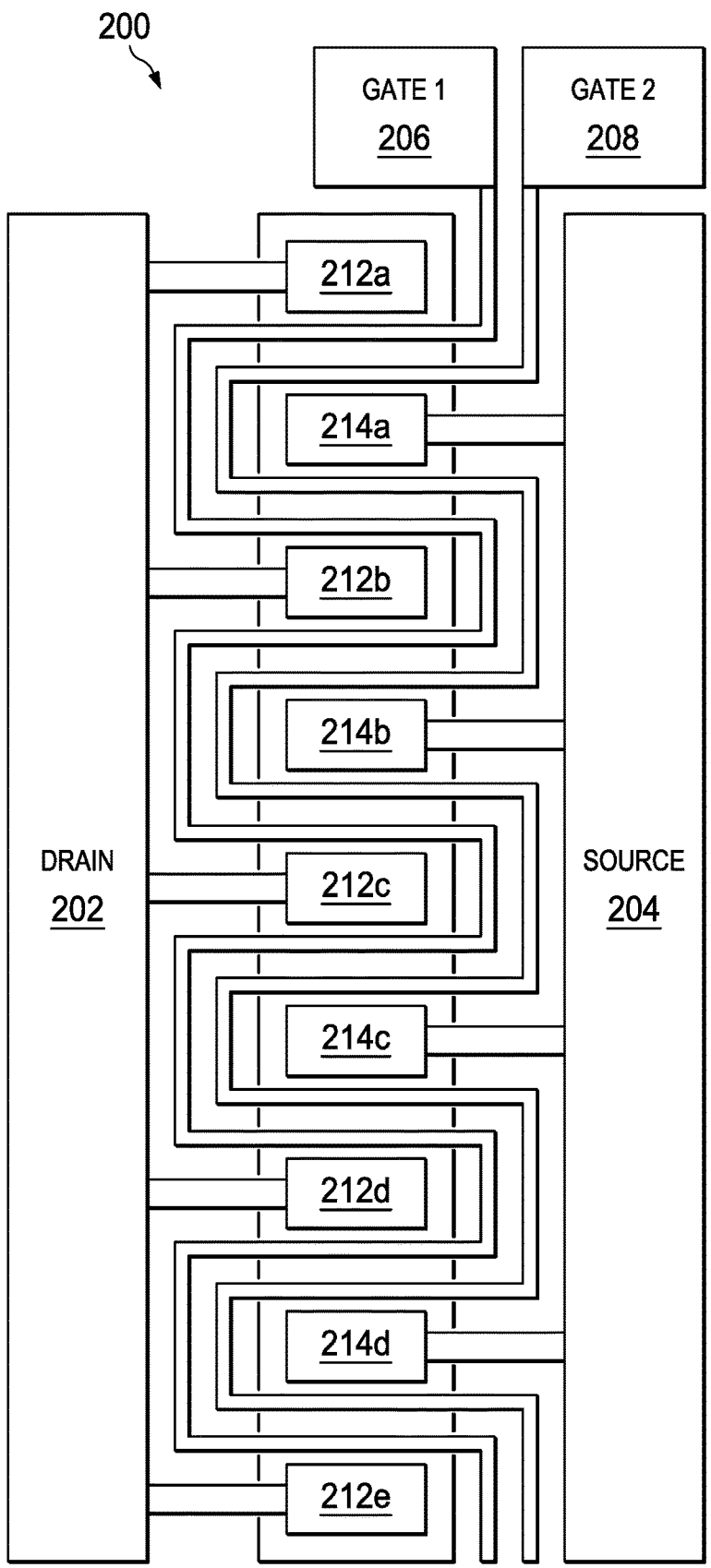
FIG. 2 is a schematic diagram of a top-down view of a set of multi-gate gallium nitride transistor in accordance with embodiments of the present disclosure.

FIG. 2 is a schematic diagram of a top-down view of a set of multi-gate gallium nitride transistor 200 in accordance with embodiments of the present disclosure. Transistor 200 includes two gate electrodes: gate 1 206 and gate 2 208, though more than 2 gates can be used.

The GaN transistor 200 can include a drain 202 and a source 204. The drain 202 can include a plurality of drain electrodes 212a, 212b, 212c, 212d, and 212e. The drain electrodes can be formed to have a common contact point (drain 202). The electrodes can be spaced apart so that a source electrode 214a can be disposed between the electrode 212a and 212b, a source electrode 214b can be disposed between the electrode 212b and 212c, a source electrode 214c can be disposed between the electrode 212c and 212d, and a source electrode 214d can be disposed between the electrode 212d and 212e. The gate electrodes 206 and 208 can be formed. The gate 206 can include a gate electrode 216 that can be disposed in the gaps between each source and drain. The gate 208 can include a gate electrode 218 that can be disposed in the gaps between each source and drain. The gate electrode 216 and the gate electrode 218 are adjacent to each other.

Figure 3K:
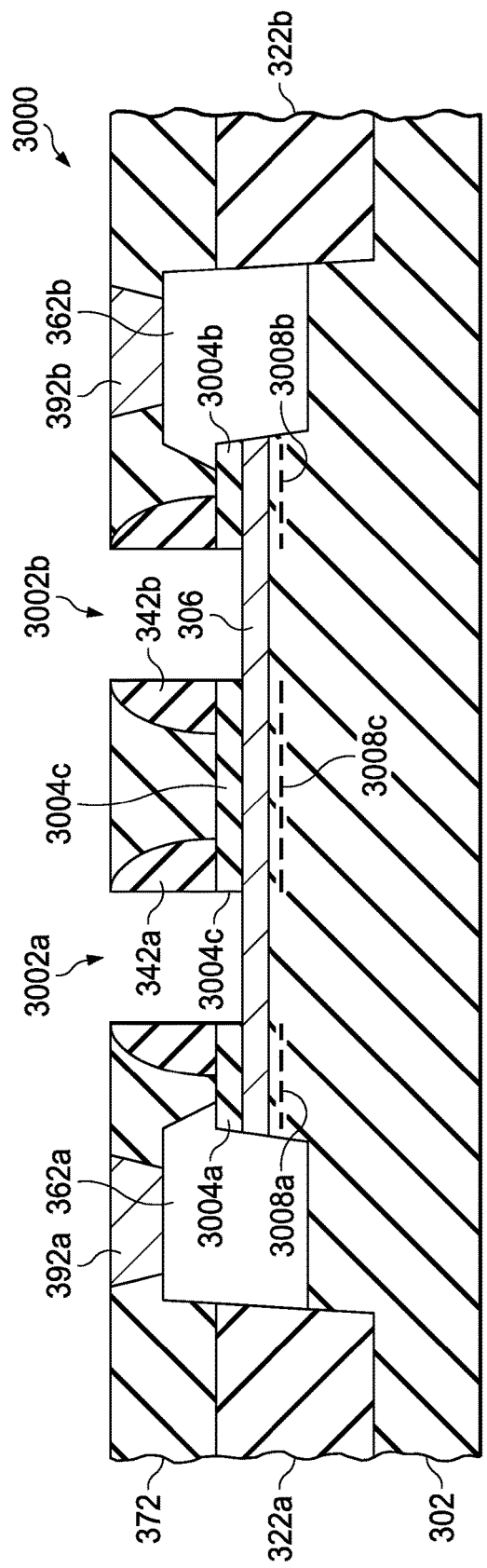

FIG. 3A-3L are schematic diagrams illustrating a process flow for fabricating a multi-gate gallium nitride transistor. FIG. 3A is a schematic diagram 300 illustrating the forming a polarization layer 304 on a gallium nitride (GaN) layer 302. The GaN layer 302 is formed from a silicon substrate. The polarization layer 304 can include aluminum indium nitride ($Al_xIn_{1-x}N$, where $0.8<x<0.9$) or aluminum gallium nitride ($Al_xGa_{1-x}N$, where $0.1<x<0.5$). The polarization layer 304 can be grown to a thickness of 5-30 nm. The polarization layer 304 can be grown epitaxially on the GaN layer 302. In some embodiments, an interlayer 306 can be formed on the GaN layer 302. The interlayer 306 can include aluminum nitride (AlN), which can assist in the epitaxial growth of the polarization layer 304. The interlayer 306 can be a 1-2 nm layer of AlN.

The formation of the polarization layer 304 can cause the formation of a two dimensional electron gas (2DEG) 308 near the surface of the GaN layer 302.

FIG. 3B is a schematic diagram 310 illustrating the etching of the GaN layer 302. The GaN layer 302 and the polarization layer 304 (and underlying interlayer 306) can be etched using known etching techniques. The substrate is etched at a region that defines the edge of the transistor device. The etched portion of the substrate 312a and 312b are sites for depositing an isolation dielectric material that isolates the GaN transistor from other devices on the substrate.

FIG. 3C is a schematic diagram 320 illustrating the formation of the isolation dielectric material. The isolation dielectric material 322a and 322b can include silicon dioxide ($SiO_2$). The isolation dielectric material can be deposited in known ways for forming oxide layers on the gallium nitride.

FIG. 3D is a schematic diagram 330 illustrating the formation of "dummy" gates 322a and 332b. The dummy gates formed at predetermined locations using lithographic techniques. The dummy gates 332a and 332b are formed to create a positive space around with other components of the transistors can be formed. As will be discussed later, the gate electrodes are formed after other components are formed.

FIG. 3E is a schematic diagram 340 illustrating the formation of spacer dielectrics 342a and 342b adjacent to the dummy gates 332a and 332b. The spacers 342a and 342b can be formed from lithographic deposition of silicon nitride (SiN) or other dielectric materials. The spacers 342a and 342b facilitate the subsequently described selective removal of the dummy gates 332a and 332b.

FIG. 3F is a schematic diagram 350 illustrating etching the GaN layer 302 for forming the source and drain. The GaN layer 302 is etched in an area 352a between the isolation dielectric 322a and the dummy electrode 332a (or the spacer 342a if the spacer is formed). The polarization layer 304 (and underlying AlN layer 306) is etched as well as the GaN layer 302. After the etching, a portion of the polarization layer 304 remains between the exposed area 352a and the dummy electrode 332a. After the etching, a portion of the polarization layer 304 remains between the exposed area 352b and the dummy electrode 332b.

FIG. 3G is a schematic diagram 360 illustrating formation of the source and drain electrodes. A drain semiconductor material 362a is grown for the drain. A source semiconductor material 362b is grown for the source. The drain semiconductor 362a and source semiconductor 362b can be formed from indium gallium nitride ($In_xGa_{1-x}N$, 5%<x<15%).

FIG. 3H is a schematic diagram 370 illustrating forming an interlayer dielectric 372 and planarization. The interlayer dielectric 372 can include a silicon dioxide or other oxide layer. The interlayer dielectric 372 can cover the isolation dielectric 322a and 322b, the drain and source semiconductor 362a and 362b, and the polarization layer 304.

FIG. 3I is a schematic diagram 380 illustrating forming a contact trench for the source and drain. The drain contact trench 382a can be formed by etching the interlayer dielectric 372 at a location above the drain semiconductor material 362a. The source contact trench 382b can be formed by etching the interlayer dielectric 372 at a location above the drain semiconductor material 362b.

FIG. 3J is a schematic diagram 390 illustrating forming the drain and source metal for the drain electrode and the source electrode. The drain metal 392a is deposited in the drain contact trench 382a on the drain semiconductor material 362a. The source metal 392b is deposited in the source contact trench 382b on the source semiconductor material 362b. The drain metal 392a and the source metal 392b can include titanium or tungsten.

FIG. 3K is a schematic diagram 3000 for removing the dummy gates. The dummy electrodes 332a and 332b can be removed by etching. The etching also removes a portion of the polarization layer located below the dummy gates. The resulting structure includes polarization layer 3004a adjacent the drain semiconductor material 362a, the polarization layer 3004c between gate trenches 3002a and 2002b, and the polarization layer 3004b adjacent to the source semiconductor material 362b. The polarization layer 3004a creates a 2DEG 3004a with the GaN layer 302. The 2DEG 3004a extends from the semiconductor material 362a to the edge of the gate trench 3002a. The polarization layer 3004b creates a 2DEG 3004b with the GaN layer 302. The 2DEG 3004b extends from the semiconductor material 362b to the edge of the gate trench 3002b. The 2DEG 3004c extends between the edges of the two gate trenches 3002a and 3002b. In some embodiments, the gate trench is etched to the GaN layer 302. In some embodiments, the gate trench is etched to the AlN layer 306.

Figure 3L:
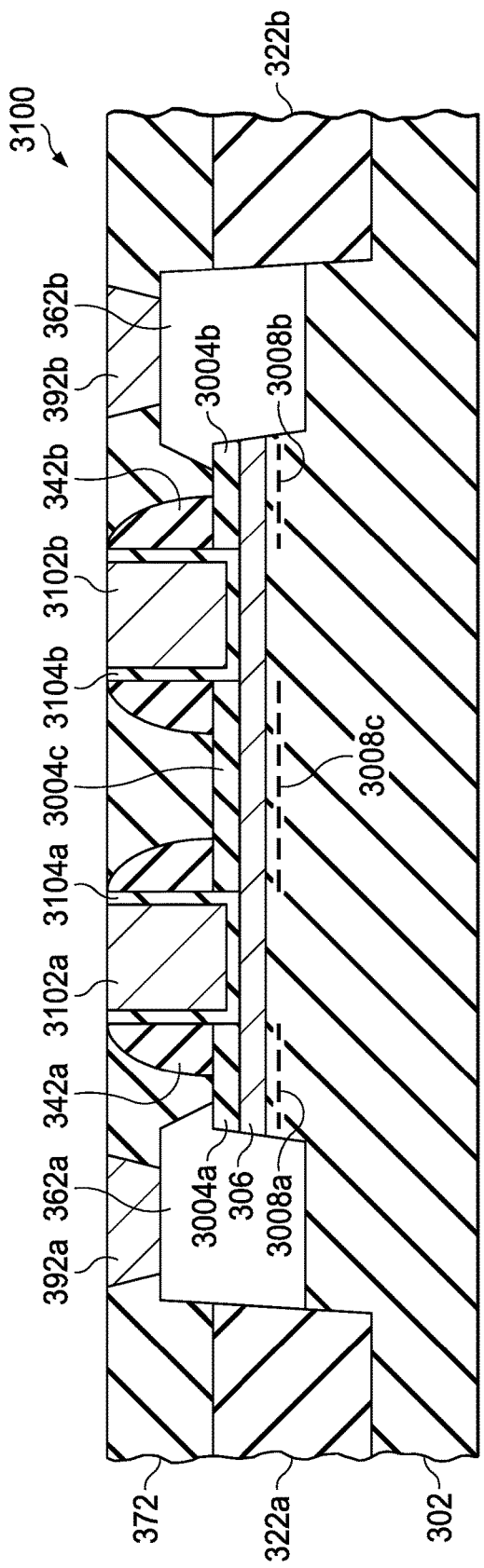

FIG. 3L is a schematic diagram 3100 for forming gate electrodes. A gate dielectric 3104a can be deposited in the gate trench 3002a. A gate metal can be deposited on the gate dielectric 3102a. A gate dielectric 3104b can be deposited in the gate trench 3002b. A gate metal can be deposited on the gate dielectric 3102b. The polarization layer 3004a creates a 2DEG 3004a with the GaN layer 302. The 2DEG 3004a extends from the semiconductor material 362a to the edge of the gate dielectric 3104a. The polarization layer 3004b creates a 2DEG 3004b with the GaN layer 302. The 2DEG 3004b extends from the semiconductor material 362a to the edge of the gate dielectric 3104b. The 2DEG 3004c extends between the edges of the two gate dielectrics 3104a and 3104b. The gate metal can include titanium nitride.

Figure 4:
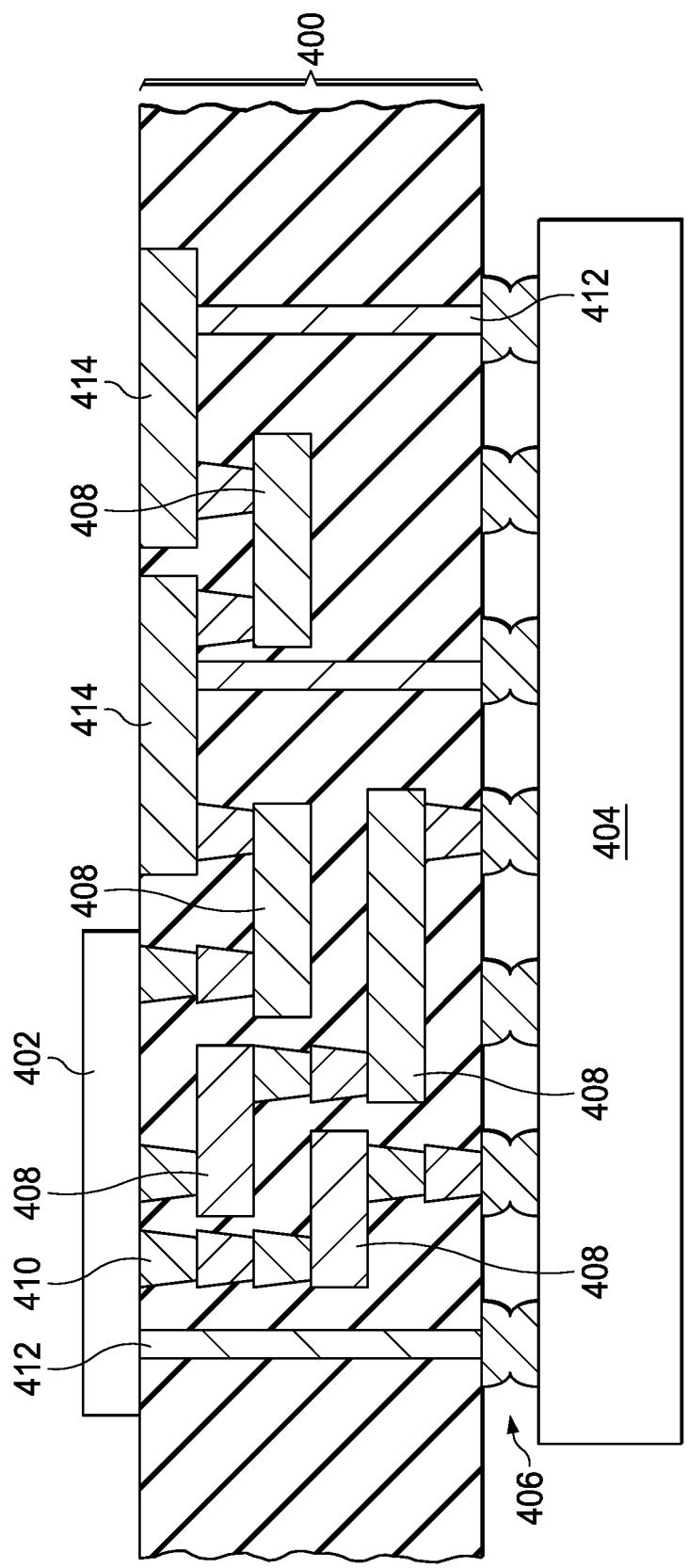
FIG. 4 is an interposer implementing one or more embodiments of the disclosure.

FIG. 4 illustrates an interposer 400 that includes one or more embodiments of the disclosure. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the disclosure, apparatuses or processes disclosed herein may be used in the fabrication of interposer 400.

Figure 5:
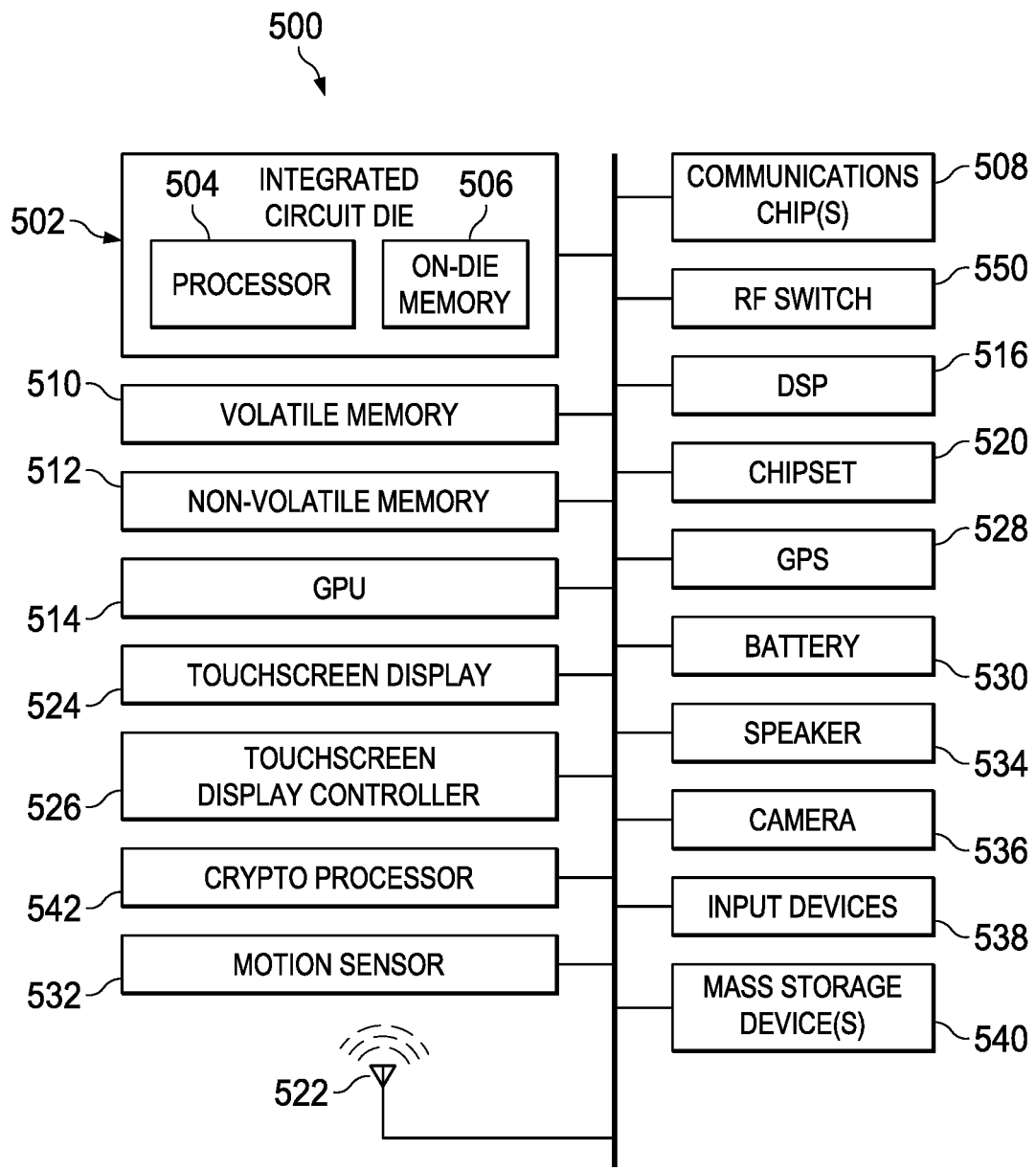
FIG. 5 is a computing device built in accordance with an embodiment of the disclosure.

FIG. 5 illustrates a computing device 500 in accordance with one embodiment of the disclosure. The computing device 500 may include a number of components. In one embodiment, these components are attached to one or more motherboards. In an alternate embodiment, some or all of these components are fabricated onto a single system-on-a-chip (SoC) die. The components in the computing device 500 include, but are not limited to, an integrated circuit die 502 and at least one communications logic unit 508. In some implementations the communications logic unit 508 is fabricated within the integrated circuit die 502 while in other implementations the communications logic unit 508 is fabricated in a separate integrated circuit chip that may be bonded to a substrate or motherboard that is shared with or electronically coupled to the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STT-MRAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a voltage regulator (not shown), a global positioning system (GPS) device 528, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The non-volatile memory can include a magnetoresistive random-access memory (MRAM) 550. MRAM 550 can include one or more MTJ stacks 552. MTJ stack 552 can be similar to the MTJ stack described in FIG. 2 and include a synthetic antiferromagnet that includes a diffusion barrier between two ferromagnetic layers.

The communications logic unit 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communications logic units 508. For instance, a first communications logic unit 508 may be dedicated to shorter range wireless communications such as Wi-Fi and Bluetooth and a second communications logic unit 508 may be dedicated to longer range wireless communications such as GPS, EDGE, GPRS, CDMA, WiMAX, LTE, Ev-DO, and others.

In various embodiments, the computing device 500 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
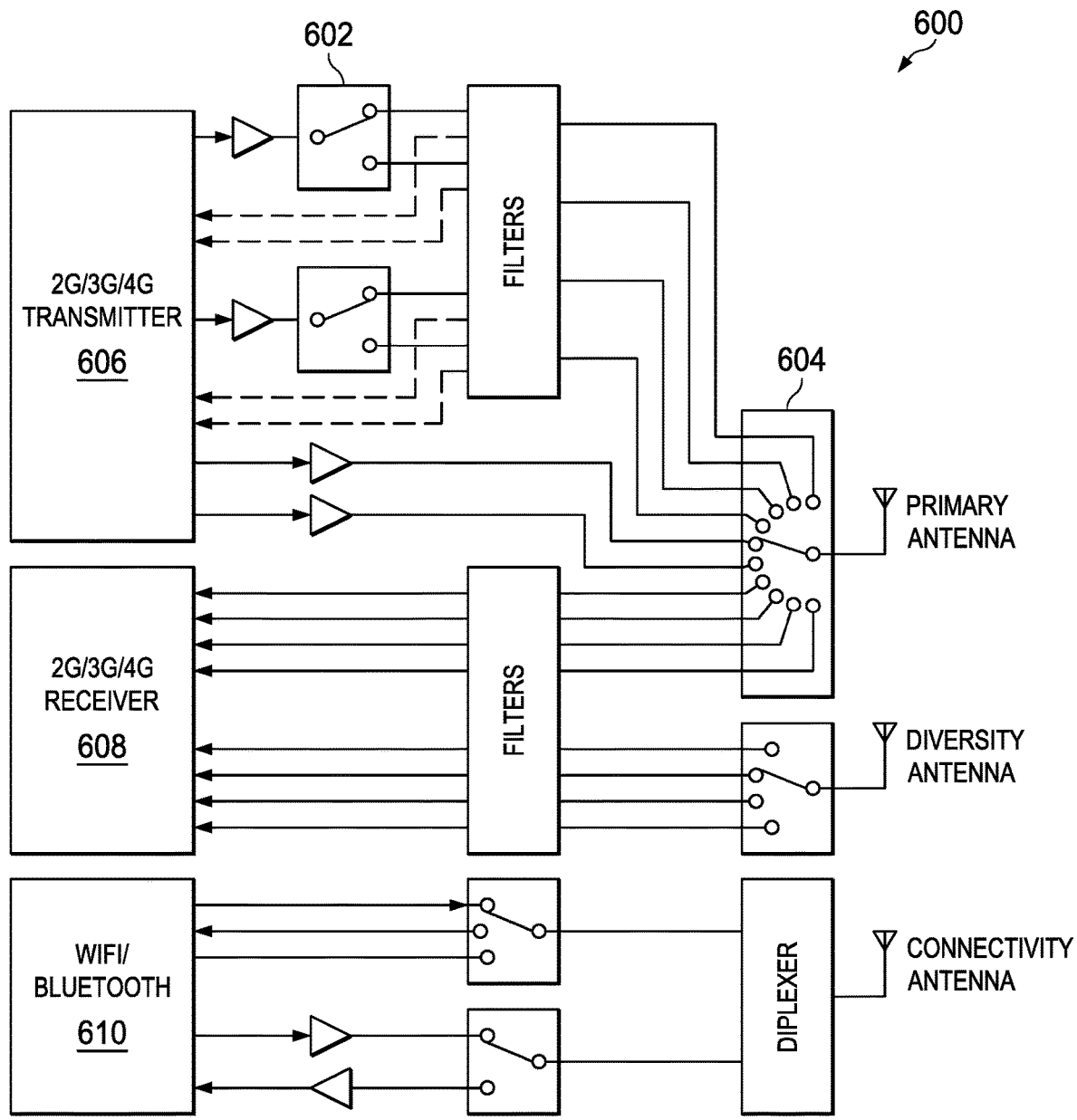
FIG. 6 is a schematic diagram of an example circuit for a radio frequency frontend for a communication device in accordance with embodiments of the present disclosure.

FIG. 6 is a schematic diagram of an example circuit for a radio frequency frontend 600 for a communication device in accordance with embodiments of the present disclosure. The frontend 600 includes a plurality of switches, such as switch 602 or 604. Switch 602 can include one or more multi-gate gallium nitride transistors, such as those described in FIGS. 1 and 2. Additionally, the frontend 600 can include a transmitter 606, which can be a radio transmitter for cellular transmissions. The frontend 600 can also include a receiver 608, which can be a radio receiver. The frontend 600 can also include a wifi and/or Bluetooth transceiver 610.

Figure 7A:
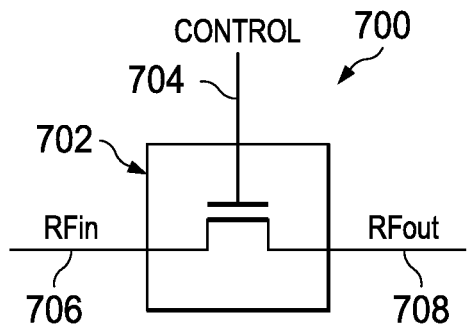
FIG. 7A-C are a schematic diagrams of example radio frequency circuits with multi-gate transistors in accordance with embodiments of the present disclosure.
Figure 7B:
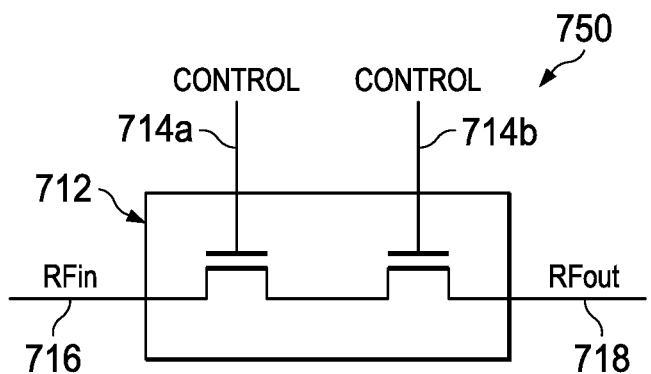
Figure 7C:
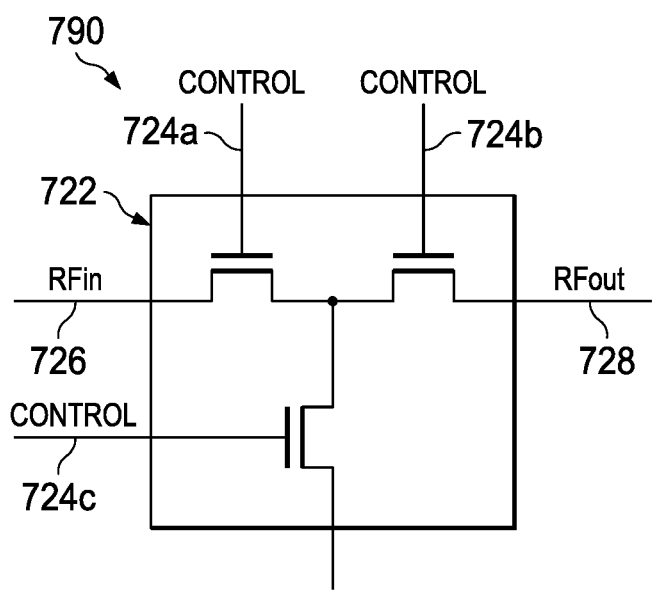

FIG. 7A is a schematic diagram of an example radio frequency circuit 700 with a GaN multi-gate transistor 702 in accordance with embodiments of the present disclosure. The GaN multi-gate transistor 702 includes a RF input 706 and an RF output 708. The RF circuit 700 can be switched by a control element 704. The GaN multi-gate transistor 702 can include a multi-gate transistor as shown in FIG. 1 (or could include more than 2 gates). FIG. 7B is a schematic diagram of an example radio frequency circuit 750 with a multi-gate transistor 712 in accordance with embodiments of the present disclosure. The GaN multi-gate transistor 712 includes a RF input 716 and an RF output 718. The RF circuit 750 can be switched by a control gates 714a and 714b. The GaN multi-gate transistor 712 can include a multi-gate transistor as shown in FIG. 1 (or could include more than 2 gates). FIG. 7C is a schematic diagram of an example radio frequency circuit 700 with a multi-gate transistor 702 in accordance with embodiments of the present disclosure. The GaN multi-gate transistor 722 includes a RF input 726 and an RF output 728. The RF circuit 790 can be switched by a control gates 724a and 724b. An additional control element 724c can be used to provide further control over switching the RF signal. The GaN multi-gate transistor 722 can include a multi-gate transistor as shown in FIG. 1 (or could include more than 2 gates).

The following paragraphs provide examples of various ones of the embodiments disclosed herein.

Example 1 is a multi-gate gallium nitride transistor that includes a gallium nitride layer, a drain electrode electrically coupled to the gallium nitride layer, a source electrode electrically coupled to the gallium nitride layer, a first gate electrode located adjacent to the drain electrode, a second gate electrode located between the first gate electrode and the source electrode, and a polarization layer located between the first gate electrode and the second gate electrode.

Example 2 may include the subject matter of example 1, and may also include a two dimensional electron gas (2DEG) at an interface between the polarization layer and the gallium nitride layer, the 2DEG electrically coupling the first gate electrode and the second gate electrode.

Example 3 may include the subject matter of any of examples 1 or 2, and may also include a drain-side polarization layer located between the drain and the first gate.

Example 4 may include the subject matter of example 3, and may also include a 2DEG located between the drain electrode and the first gate electrode at an interface between the drain-side polarization layer and the gallium nitride layer.

Example 5 may include the subject matter of any of examples 1 or 2 or 3, and may also include a source-side polarization layer located between the source electrode and the second gate electrode.

Example 6 may include the subject matter of example 5, and may also include a 2DEG located between the second gate electrode and the source electrode at an interface between the source-side polarization layer and the gallium nitride layer.

Example 7 may include the subject matter of any of examples 1 or 2, and further include an aluminum nitride layer disposed between the gallium nitride layer and the polarization layer.

Example 8 may include the subject matter of any of examples 1 or 2 or 7, and also include a first dielectric layer located between the first gate electrode and the polarization layer, and a second dielectric layer located between the second gate electrode and the polarization layer.

Example 9 may include the subject matter of any of examples 1 or 2 or 3 or 4 or 5 or 6 or 7 or 8, and also include a gallium nitride spacer in contact with sidewalls of the first gate electrode, and a gallium nitride spacer in contact with sidewalls of the second gate electrode.

Example 10 may include the subject matter of any of examples 1 or 2 or 7 or 8 or 9, wherein one or both of the drain electrode or the source electrode comprises a metal contact located on a doped semiconducting material.

Example 11 may include the subject matter of example 10, wherein the doped semiconducting material comprises indium gallium nitride.

Example 12 may include the subject matter of example 1, wherein the polarization layer comprises aluminum indium nitride or aluminum gallium nitride.

Example 13 may include the subject matter of any of examples 1 or 2 or 7 or 8 or 9 or 10, and also include a third gate electrode residing between the second gate electrode and the source electrode, a fourth polarization layer between the third gate electrode and the source; and a 2DEG at an interface between the fourth polarization layer and the gallium nitride layer and between the third gate electrode and the source electrode.

Example 14 is a method for fabricating a multi-gate gallium nitride transistor on a gallium nitride layer, the method may include forming an aluminum nitride layer on the gallium nitride surface; forming a polarization layer on the aluminum nitride layer; forming a first gate electrode on the exposed first portion of the aluminum nitride layer; forming a second gate electrode on the exposed second portion of the aluminum nitride layer; forming a drain electrode proximate the first gate electrode; and forming a source electrode proximate the second gate electrode, the first gate electrode and the second gate electrode formed between the drain electrode and the source electrode.

Example 15 may include the subject matter of example 14, wherein forming the first gate electrode may include forming a gate dielectric in the exposed first portion of the aluminum nitride layer, and forming a gate metal on the first gate dielectric; and wherein forming the second gate electrode may include forming a second gate dielectric; and forming a second gate metal on the second gate dielectric.

Example 16 may include the subject matter of any of examples 14 or 15, wherein forming the drain electrode may include forming a doped semiconductor on the gallium nitride layer; and forming a metal electrode on the doped semiconductor; and wherein forming a source electrode may include forming a doped semiconductor on the gallium nitride layer; and forming a metal electrode on the doped semiconductor.

Example 17 may include the subject matter of any of examples 14 or 15 or 16, wherein forming the doped semiconductor comprises forming indium gallium nitride on the gallium nitride layer; and wherein forming the metal electrode comprises depositing titanium or tungsten on the indium gallium nitride.

Example 18 may include the subject matter of example 14, wherein forming the polarization layer may include epitaxially growing the polarization layer on the aluminum nitride layer.

Example 19 may include the subject matter of any of examples 14 or 15, wherein the polarization layer comprises aluminum gallium nitride, aluminum indium nitride, or aluminum gallium indium nitride, or a layered combination of any of aluminum gallium nitride, aluminum indium nitride, or aluminum gallium indium nitride.

Example 20 is a computing device that includes a processor mounted on a substrate; a communications logic unit within the processor; a memory within the processor; a graphics processing unit within the computing device; an antenna within the computing device; a display on the computing device; a battery within the computing device; a power amplifier within the processor; and a voltage regulator within the processor. The computing device may also include a multi-gate gallium nitride transistor that includes a gallium nitride layer; a drain electrode electrically coupled to the gallium nitride layer; a source electrode electrically coupled to the gallium nitride layer; a first gate electrode located adjacent to the drain electrode; a second gate electrode located between the first gate electrode and the source electrode; a polarization layer located between the first gate electrode and the second gate electrode.

Example 21 may include the subject matter of example 20, and may also include a two dimensional electron gas (2DEG) at an interface between the polarization layer and the gallium nitride layer, the 2DEG electrically coupling the first gate electrode and the second gate electrode.

Example 22 may include the subject matter of any of examples 20 or 21, and may also include a drain-side polarization layer located between the drain and the first gate.

Example 23 may include the subject matter of example 22, and may also include a 2DEG between the drain electrode and the first gate electrode at an interface between the drain-side polarization layer and the gallium nitride layer.

Example 24 may include the subject matter of any of examples 20 or 22 or 23, further comprising a source-side polarization layer located between the source electrode and the second gate electrode.

Example 25 may include the subject matter of example 24, and may also include a 2DEG between the second gate electrode and the source electrode between the source-side polarization layer and the gallium nitride layer.

Example 26 may include the subject matter of any of examples 20, and may also include an aluminum nitride layer disposed between the gallium nitride layer and the polarization layer.

Example 27 may include the subject matter of any of examples 20 or 26, and may also include a first dielectric layer located between the first gate electrode and the polarization layer, and a second dielectric layer located between the second gate electrode and the polarization layer.

Example 28 may include the subject matter of any of examples 20 or 26 or 27, and may also include a gallium nitride spacer in contact with sidewalls of the first gate electrode, and a gallium nitride spacer in contact with sidewalls of the second gate electrode.

Example 29 may include the subject matter of any of examples 20 or 21 or 22 or 23 or 24 or 25 or 26 or 27 or 28 wherein one or both of the drain electrode or the source electrode comprises a metal contact located on a doped semiconducting material.

Example 30 may include the subject matter of example 23, wherein the doped semiconducting material comprises indium gallium nitride.

Example 31 may include the subject matter of example 220, wherein the polarization layer comprises aluminum indium nitride or aluminum gallium nitride.

Example 32 may include the subject matter of any of examples 20 or 22 or 24, and may also include a third gate electrode residing between the second gate electrode and the source electrode, a fourth polarization layer between the third gate electrode and the source.

Example 33 may include the subject matter of example 32; and may also include 2DEG at an interface between the fourth polarization layer and the gallium nitride layer between the third gate electrode and the source electrode.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A multi-gate gallium nitride transistor, comprising:
   a gallium nitride layer;
   a drain electrode electrically coupled to the gallium nitride layer;
   a source electrode electrically coupled to the gallium nitride layer;
   a first gate electrode located adjacent to the drain electrode;
   a second gate electrode located between the first gate electrode and the source electrode;
   a polarization layer located between the first gate electrode and the second gate electrode;
   an isolation layer, where the polarization layer is between the isolation layer and the gallium nitride layer;
   a first dielectric material, having a first portion between the first gate electrode and the gallium nitride layer, and having a second portion between the first gate electrode material and the isolation layer; and
   a second dielectric material, having a first portion between the second gate electrode and the gallium nitride layer, and having a second portion between the second gate electrode material and the isolation layer.

2. The gallium nitride transistor of claim 1, further comprising a two dimensional electron gas (2DEG) at an interface between the polarization layer and the gallium nitride layer, the 2DEG electrically coupling the first gate electrode and the second gate electrode.

3. The gallium nitride transistor of claim 1, further comprising a drain-side polarization layer located between the drain electrode and the first gate electrode.

4. The gallium nitride transistor of claim 3, further comprising a 2DEG between the drain electrode and the first gate electrode at an interface between the drain-side polarization layer and the gallium nitride layer.

5. The gallium nitride transistor of claim 1, further comprising a source-side polarization layer located between the source electrode and the second gate electrode.

6. The gallium nitride transistor of claim 5, further comprising a 2DEG between the second gate electrode and the source electrode at an interface between the source-side polarization layer and the gallium nitride layer.

7. The gallium nitride transistor of claim 1, further comprising an aluminum nitride layer disposed between the gallium nitride layer and the polarization layer.

8. The gallium nitride transistor of claim 1, further comprising:
   a silicon nitride spacer in contact with sidewalls of the first gate electrode, and
   a silicon nitride in contact with sidewalls of the second gate electrode.

9. The gallium nitride transistor of claim 1, wherein one or both of the drain electrode or the source electrode comprises a metal contact located on a doped semiconducting material.

10. The gallium nitride transistor of claim 9, wherein the doped semiconducting material comprises indium gallium nitride.

11. The gallium nitride transistor of claim 1, wherein the polarization layer comprises aluminum indium nitride or aluminum gallium nitride.

12. The gallium nitride transistor of claim 1, wherein the first dielectric material is not continuous with the second dielectric material.

13. A method for fabricating a multi-gate gallium nitride transistor on a gallium nitride layer, the method comprising:
   providing a drain electrode electrically coupled to the gallium nitride layer;
   providing a source electrode electrically coupled to the gallium nitride layer;
   providing a first gate electrode located adjacent to the drain electrode;
   providing a second gate electrode located between the first gate electrode and the source electrode;
   providing a polarization layer located between the first gate electrode and the second gate electrode;
   providing an isolation layer, where the polarization layer is between the isolation layer and the gallium nitride layer;
   providing a first dielectric material, having a first portion between the first gate electrode and the gallium nitride layer, and having a second portion between the first gate electrode material and the isolation layer; and
   providing a second dielectric material, having a first portion between the second gate electrode and the gallium nitride layer, and having a second portion between the second gate electrode material and the isolation layer.

14. The method of claim 13, further comprising providing a drain-side polarization layer located between the drain electrode and the first gate electrode.

15. The method of claim 13, further comprising providing a source-side polarization layer located between the source electrode and the second gate electrode.

16. The method of claim 13, further comprising providing an aluminum nitride layer disposed between the gallium nitride layer and the polarization layer.

17. The method of claim 13, further comprising providing:
- a silicon nitride spacer in contact with sidewalls of the first gate electrode, and
- a silicon nitride in contact with sidewalls of the second gate electrode.

18. The method of claim 13, wherein one or both of the drain electrode or the source electrode comprises a metal contact located on a doped semiconducting material.

19. The method of claim 13, wherein the doped semiconducting material comprises indium gallium nitride.

20. The method of claim 13, wherein the polarization layer comprises aluminum indium nitride or aluminum gallium nitride.

21. A computing device, comprising a multi-gate gallium nitride transistor, the multi-gate gallium nitride transistor comprising:
- a gallium nitride layer;
- a drain electrode electrically coupled to the gallium nitride layer;
- a source electrode electrically coupled to the gallium nitride layer;
- a first gate electrode located adjacent to the drain electrode;
- a second gate electrode located between the first gate electrode and the source electrode;
- a polarization layer located between the first gate electrode and the second gate electrode;
- an isolation layer, where the polarization layer is between the isolation layer and the gallium nitride layer;
- a first dielectric material, having a first portion between the first gate electrode and the gallium nitride layer, and having a second portion between the first gate electrode material and the isolation layer; and
- a second dielectric material, having a first portion between the second gate electrode and the gallium nitride layer, and having a second portion between the second gate electrode material and the isolation layer.

22. The computing device of claim 21, wherein the computing device includes a processor, and the multi-gate gallium nitride transistor is included in the processor.

23. The computing device of claim 22, further comprising a communications logic unit within the processor.

24. The computing device of claim 22, further comprising a memory within the processor.

25. The computing device of claim 21, wherein the multi-gate gallium nitride transistor further includes a drain-side polarization layer located between the drain electrode and the first gate electrode.

* * * * *